(12) United States Patent
Bernales et al.

(10) Patent No.: US 9,206,037 B2
(45) Date of Patent: Dec. 8, 2015

(54) MEMS DEVICE CHIP MANUFACTURING METHOD

(71) Applicant: Disco Corporation, Tokyo (JP)

(72) Inventors: Aris Bernales, Santa Clara, CA (US); Devin Martin, Santa Clara, CA (US); Mark Brown, Santa Clara, CA (US)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/196,333

(22) Filed: Mar. 4, 2014

(65) Prior Publication Data

US 2015/0251902 A1 Sep. 10, 2015

(51) Int. Cl.
*H01L 21/00* (2006.01)
*B81C 1/00* (2006.01)

(52) U.S. Cl.
CPC ......... *B81C 1/00626* (2013.01); *B81C 1/00531* (2013.01); *B81C 1/00539* (2013.01); *B81C 1/00904* (2013.01)

(58) Field of Classification Search
USPC .......................................... 438/457, 460, 462
See application file for complete search history.

(56) References Cited

U.S. PATENT DOCUMENTS

| | | | |
|---|---|---|---|
| 2003/0186513 A1* | 10/2003 | Turner et al. ................... | 438/462 |
| 2006/0292826 A1* | 12/2006 | Kajiyama et al. .............. | 438/459 |
| 2007/0111477 A1* | 5/2007 | Maruyama et al. ........... | 438/460 |
| 2008/0217743 A1* | 9/2008 | Kojima et al. ................ | 257/620 |
| 2013/0023107 A1* | 1/2013 | Martin et al. ................. | 438/458 |
| 2013/0270711 A1* | 10/2013 | Hebding et al. .............. | 257/774 |

FOREIGN PATENT DOCUMENTS

JP  07-240395  9/1995

* cited by examiner

*Primary Examiner* — Karen Kusumakar
(74) *Attorney, Agent, or Firm* — Greer Burns & Crain Ltd.

(57) ABSTRACT

A MEMS device chip manufacturing method including a grinding step of grinding a device forming area of a wafer to thereby form a recess and an annular reinforcing portion surrounding the recess, a MEMS device forming step of performing any processing including etching to the wafer after performing the grinding step to thereby form a plurality of MEMS devices partitioned by a plurality of crossing division lines in the device forming area, and a dividing step of dividing the wafer along the division lines after performing the MEMS device forming step to thereby manufacture a plurality of MEMS device chips.

2 Claims, 8 Drawing Sheets

MEMS DEVICE CHIP MANUFACTURING METHOD

BACKGROUND OF THE INVENTION

1. Field of the Invention

The present invention relates to a MEMS device chip manufacturing method.

2. Description of the Related Art

In a manufacturing process for a MEMS (Micro Electro Mechanical Systems) device such as an acceleration sensor, pressure sensor, and microphone, a plurality of MEMS devices are formed on a silicon wafer. Thereafter, the silicon wafer is divided along division lines to manufacture individual MEMS device chips. In forming the MEMS devices, the silicon wafer is subjected to photolithography and etching to thereby form a large amount of MEMS devices such as diaphragms for pressure sensors, cantilevers for acceleration sensors, and back chambers for microphones as disclosed in Japanese Patent Laid-Open No. Hei 7-240395, for example. The strength of the wafer processed by etching is reduced. Accordingly, the wafer is conventionally etched in the condition where each MEMS device has a thickness larger than necessary in order to prevent damage to the wafer in handling.

SUMMARY OF THE INVENTION

If the silicon wafer is ground to be reduced in thickness after performing photolithography and etching to the wafer to form the plural MEMS devices, there is a possibility that the MEMS devices may be damaged. Accordingly, the wafer is not ground after forming the MEMS devices by etching in the prior art, but is divided along the division lines to obtain the individual MEMS device chips. That is, in the conventional MEMS device chip manufacturing method, the MEMS device chips each having a thickness larger than necessary are manufactured. However, with a recent reduction in size and thickness of electronic equipment, it has been desired to further reduce the thickness of a MEMS device chip.

It is considered that the wafer is ground to be reduced in thickness in the condition where the wafer is attached to a support plate and next subjected to etching. However, in forming the MEMS devices on the side of the wafer where the support plate is attached, the wafer must be once peeled from the support plate, so that the steps may become troublesome. Furthermore, there is a possibility that the wafer may be damaged in handling.

It is therefore an object of the present invention to provide a MEMS device chip manufacturing method which can form MEMS device chips reduced in thickness.

In accordance with an aspect of the present invention, there is provided a MEMS device chip manufacturing method including a grinding step of grinding a device forming area of a wafer to thereby form a recess and an annular reinforcing portion surrounding the recess; a MEMS device forming step of performing any processing including etching to the wafer after performing the grinding step to thereby form a plurality of MEMS devices partitioned by a plurality of crossing division lines in the device forming area; and a dividing step of dividing the wafer along the division lines after performing the MEMS device forming step to thereby manufacture a plurality of MEMS device chips.

Preferably, the dividing step includes a modified layer forming step of applying a laser beam having a transmission wavelength to the wafer along each division line so as to focus the laser beam inside the wafer, thereby forming a modified layer inside the wafer along each division line; and an external force applying step of applying an external force to the wafer after performing the modified layer forming step to thereby divide the wafer into the individual MEMS device chips along each division line where the modified layer is formed as a break start point.

In the MEMS device chip manufacturing method of the present invention, the device forming area of the wafer is preliminarily ground to be reduced in thickness, thereby forming the recess in this device forming area and the annular reinforcing portion surrounding the recess. Thereafter, the wafer is subjected to any processing including etching to thereby form the MEMS devices in the device forming area. Accordingly, the MEMS device chips reduced in thickness over the prior art can be formed.

The device forming area reduced in thickness by grinding is subjected to etching. Accordingly, in the case of leaving a desired thickness or forming a through hole in the device forming area by etching, the etching time can be reduced. Further, although the thickness of the device forming area is reduced by grinding, damage to the wafer in handling can be prevented because the annular reinforcing portion is formed. Further, since no support plate is used in the MEMS device chip manufacturing method of the present invention, good economy can be achieved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
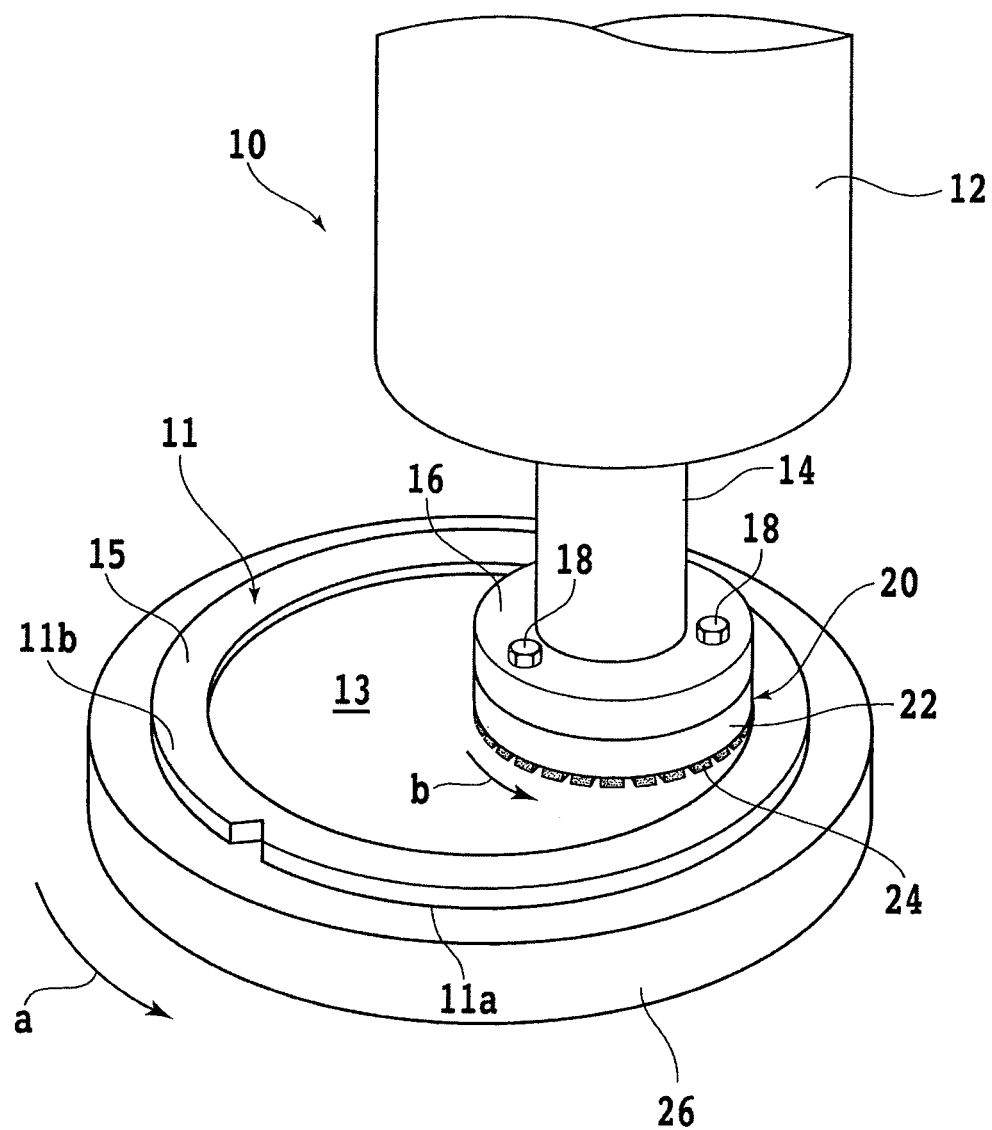
FIG. 1 is a perspective view showing a grinding step.
Figure 2:
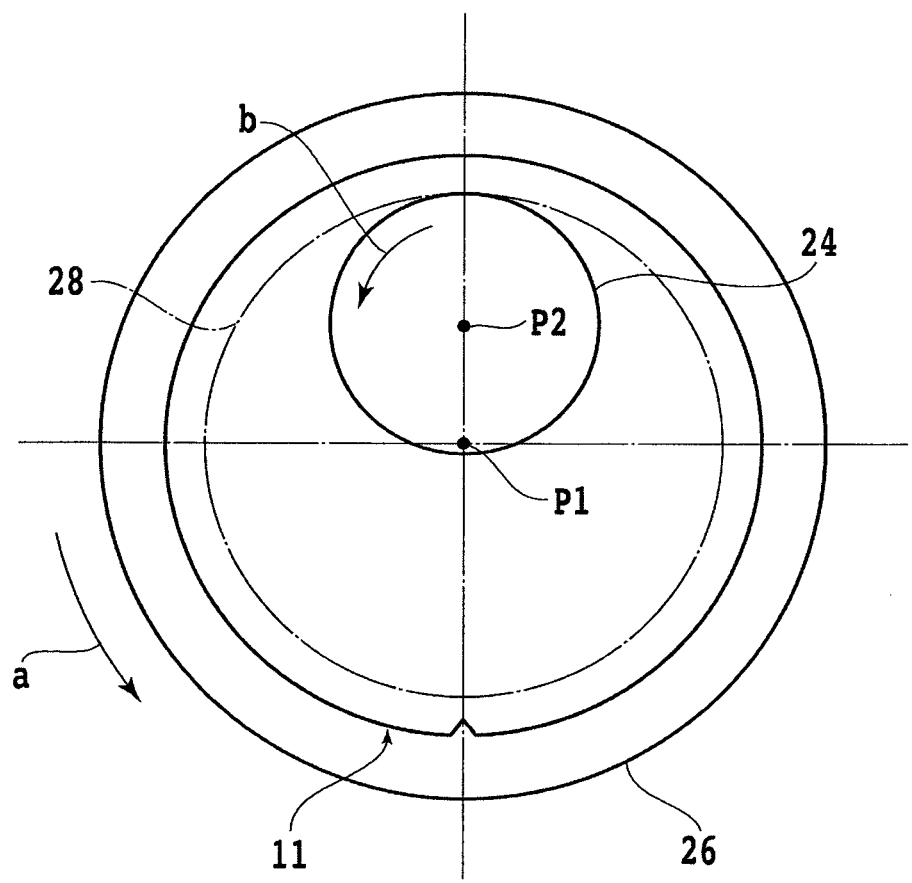
FIG. 2 is a plan view for illustrating the grinding step.

A preferred embodiment of the present invention will now be described in detail with reference to the drawings. FIG. 1 is a perspective view showing a grinding step in this preferred embodiment, and FIG. 2 is a plan view for illustrating the grinding step. Reference numeral 11 denotes a silicon wafer as a workpiece to be processed by the grinding step. The silicon wafer 11 is a wafer obtained by slicing a silicon ingot with a wire saw or the like and next polishing both side surfaces to mirror surfaces. For example, the silicon wafer 11 has a thickness of 700 μm. The silicon wafer (which will be hereinafter referred to simply as wafer) 11 has not yet been formed with MEMS devices. For convenience of illustration, the device forming surface of the wafer 11 on which the MEMS devices will be formed later is defined as a front side 11a and the other side surface opposite to the device forming surface is defined as a back side 11b.

As shown in FIG. 1, a grinding apparatus includes a grinding unit 10. The grinding unit 10 includes a spindle housing 12, a spindle 14 rotatably supported to the spindle housing 12, a motor (not shown) provided in the spindle housing 12 for rotationally driving the spindle 14, a wheel mount 16 fixed to the lower end of the spindle 14, and a grinding wheel 20 detachably mounted on the lower surface of the wheel mount 16 by a plurality of screws 18. The grinding wheel 20 is composed of an annular wheel base 22 and an abrasive ring 24 fixed to the lower surface of the wheel base 22. The abrasive ring 24 is composed of a plurality of abrasive members annularly arranged at given intervals along the outer circumference of the wheel base 22. The grinding apparatus further includes a rotatable chuck table 26 for holding the wafer 11 under suction.

In performing the grinding step by using the grinding apparatus mentioned above, the wafer 11 is held on the chuck table 26 under suction in the condition where the front side 11a of the wafer 11 is in contact with the upper surface of the chuck table 26, i.e., the back side 11b of the wafer 11 is exposed. Thereafter, the wafer 11 is ground in only a device forming area by the grinding wheel 20, thereby forming a circular recess 13 and an annular reinforcing portion 15 surrounding the circular recess 13. That is, the circular recess 13 is formed in the device forming area, and the annular reinforcing portion 15 is formed in a peripheral marginal area surrounding the device forming area. More specifically, as shown in FIG. 1, the chuck table 26 is rotated at 300 rpm, for example, in the direction shown by an arrow a, and the grinding wheel 20 is rotated at 6000 rpm, for example, in the direction shown by an arrow b. Further, a grinding unit feeding mechanism (not shown) is operated to bring the abrasive ring 24 of the grinding wheel 20 into contact with the back side 11b of the wafer 11. Thereafter, the grinding wheel 20 is fed downward by a predetermined amount at a predetermined feed rate. As a result, the back side 11b of the wafer 11 is ground in only the device forming area to form the circular recess 13. At the same time, the peripheral marginal area is left to form the annular reinforcing portion 15.

The relation between the wafer 11 and the grinding wheel 20 in performing the grinding step will now be described with reference to FIG. 2. The center P1 of rotation of the chuck table 26 and the center P2 of rotation of the abrasive ring 24 (i.e., the grinding wheel 20) are deviated from each other as shown in FIG. 2. Further, the outer diameter of the abrasive ring 24 is set smaller than the diameter of a boundary circle 28 between the device forming area and the peripheral marginal area of the wafer 11 and slightly larger than the radius of this boundary circle 28. Accordingly, the abrasive ring 24 passes through the center P1 of rotation of the chuck table 26.

Figure 3:
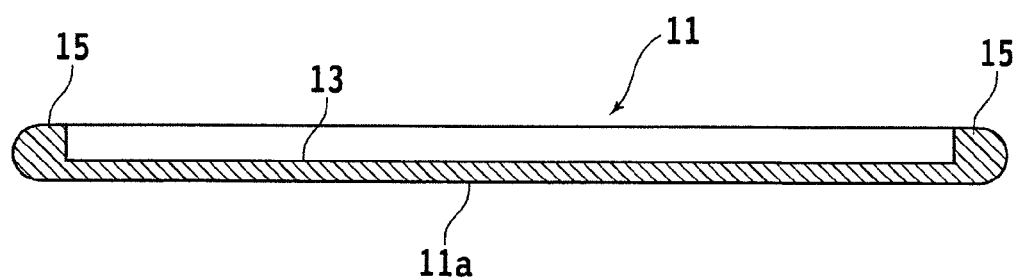
FIG. 3 is a sectional view of a wafer processed by the grinding step.

FIG. 3 is a sectional view of the wafer 11 processed by the grinding step mentioned above. By performing this grinding step, the thickness of the device forming area of the wafer 11 is reduced to 100 μm, for example. On the other hand, the thickness of the peripheral marginal area of the wafer 11, i.e., the thickness of the annular reinforcing portion 15 remains unchanged to have the original thickness of the wafer 11, or 700 μm in this preferred embodiment.

Figure 4:
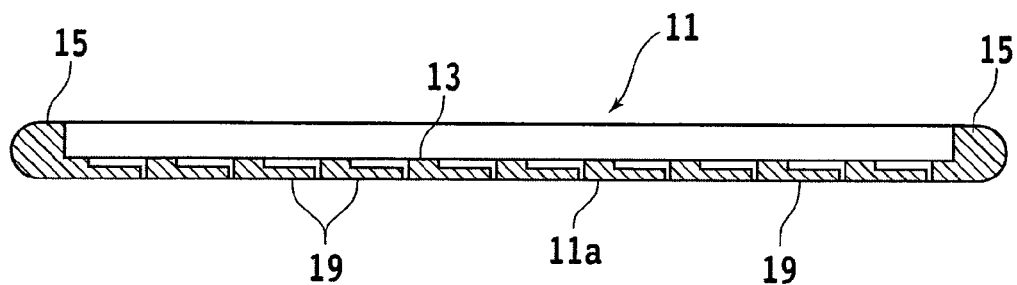
FIG. 4 is a sectional view of the wafer processed by a MEMS device forming step.
Figure 5:
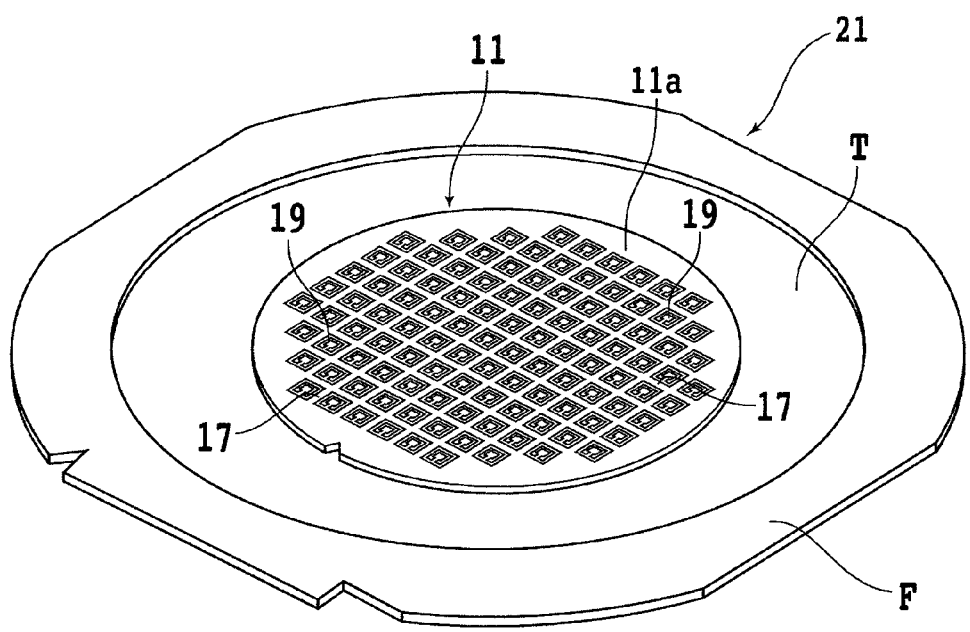
FIG. 5 is a perspective view of a wafer unit obtained by supporting the wafer shown in FIG. 4 through an expansible tape to an annular frame.

After performing this grinding step, a MEMS device forming step is performed in such a manner that any processing including a photolithography process and an etching process is performed to the wafer 11 to thereby form a plurality of MEMS devices 19 partitioned by a plurality of crossing division lines 17 on the wafer 11 as shown in FIGS. 4 and 5. In this preferred embodiment, the plural division lines 17 are composed of a plurality of division lines extending in a first direction and a plurality of division lines extending in a second direction perpendicular to the first direction. As shown in FIG. 4, the plural MEMS devices 19 are formed on the front side 11a of the wafer 11 opposite to the back side 11b where the circular recess 13 is formed. The etching process may be arbitrarily selected from wet etching and dry etching.

After performing the MEMS device forming step mentioned above, the back side 11b of the wafer 11 is attached to an expansible tape T by using a vacuum mounter (not shown) as shown in FIG. 5. The expansible tape T is preliminarily attached at its peripheral portion to an annular frame F. Thus, the wafer 11 having the MEMS devices 19 is supported through the expansible tape T to the annular frame F, thereby forming a wafer unit 21 as shown in FIG. 5. As a modification, the front side 11a of the wafer 11 may be attached to a foamed release tape, depending upon the strength of each MEMS device 19.

Figure 6:
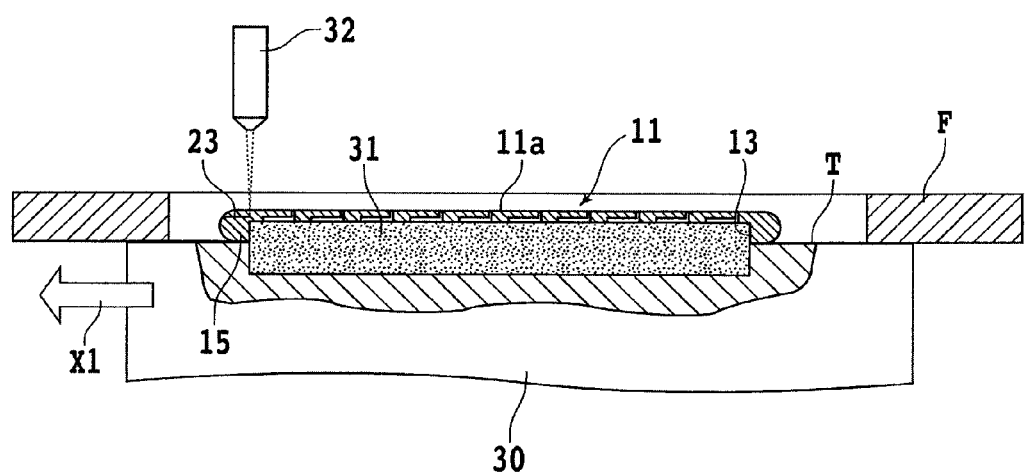
FIG. 6 is a sectional view showing a modified layer forming step.

After forming the wafer unit 21 as mentioned above, a modified layer forming step is performed as shown in FIG. 6 in such a manner that the wafer 11 is held through the expansible tape T on a chuck table 30 in a laser processing apparatus under suction and a laser beam is applied from focusing means 32 of a laser beam applying unit 34 (see FIG. 7) to the wafer 11 held on the chuck table 30, thereby forming a modified layer 23 as a division start point inside the wafer 11 along each division line 17. As shown in FIG. 6, the chuck table 30 has a suction holding portion 31 projecting upward and adapted to be fitted into the circular recess 13 formed on the back side 11b of the wafer 11.

Figure 7:
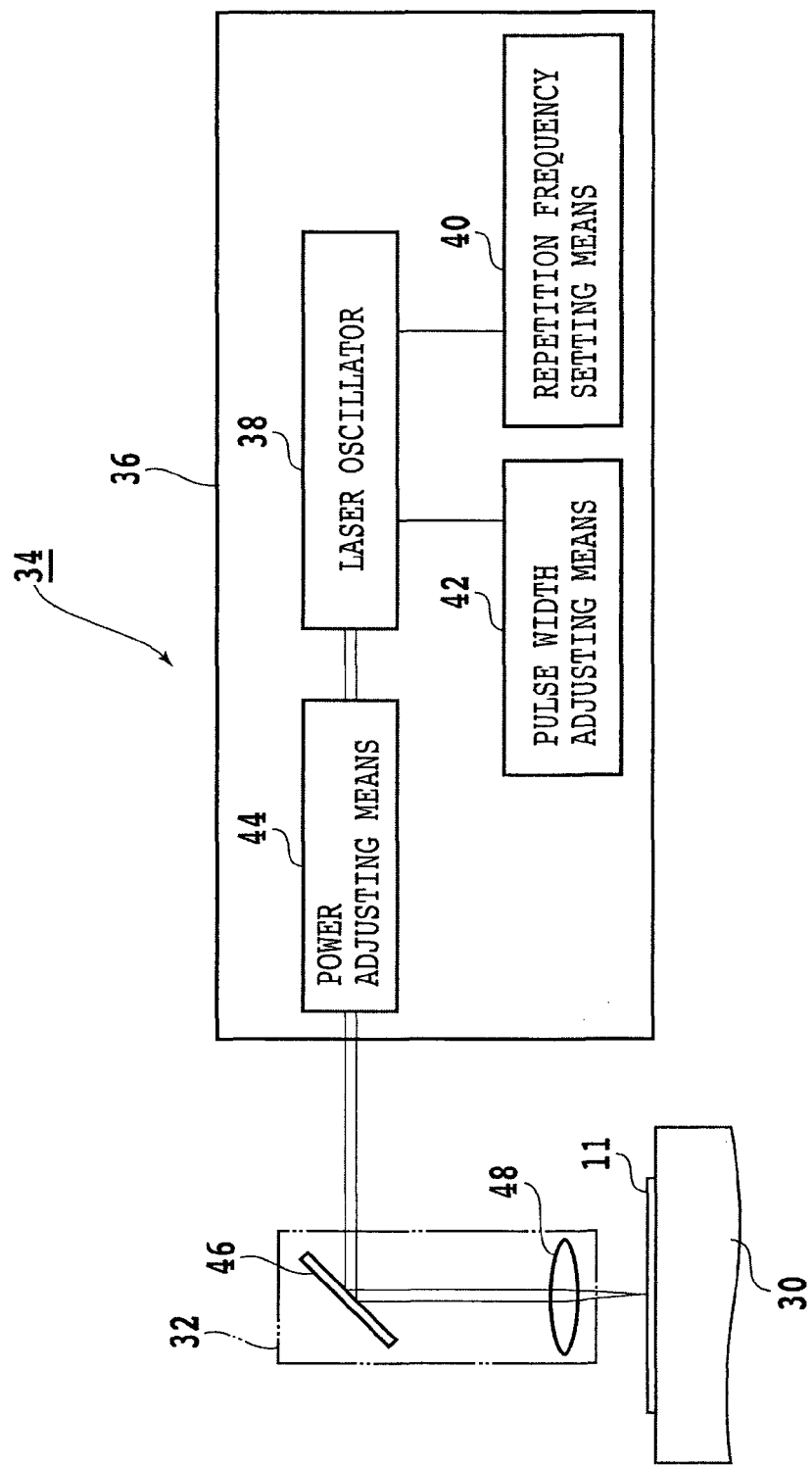
FIG. 7 is a block diagram of a laser beam applying unit.

As shown in FIG. 7, the laser beam applying unit 34 is composed of a laser beam generating unit 36 and the focusing means 32 mentioned above. The laser beam generating unit 36 includes a laser oscillator 38 for oscillating YAG laser or YVO4 laser, repetition frequency setting means 40, pulse width adjusting means 42, and power adjusting means 44. The power of a pulsed laser beam oscillated from the laser oscillator 38 is adjusted to a predetermined power by the power adjusting means 44 of the laser beam generating unit 36 is reflected by a mirror 46 in the focusing means 32 and next focused by a focusing objective lens 48 in the focusing means 32. The focused laser beam from the focusing means 32 is applied to the wafer 11 held on the chuck table 30.

In performing the modified layer forming step, a laser beam having a transmission wavelength to the wafer 11 is focused at a point inside the wafer 11 by the focusing means 32, and the chuck table 30 is fed in the direction shown by an arrow X1 in FIG. 6, thereby forming a modified layer 23 inside the wafer 11 along a predetermined one of the division lines 17 extending in the first direction. Thereafter, the chuck table 30 is indexed in the direction perpendicular to the direction X1 by the pitch of the division lines 17 to similarly perform the laser processing along the next division line 17. Such an operation is sequentially performed along all of the division lines 17 extending in the first direction, thereby forming a plurality of modified layers 23 inside the wafer 11 along all of the division lines 17 extending in the first direction. Thereafter, the chuck table 30 is rotated 90° to similarly form a plurality of modified layers 23 inside the wafer 11 along the other division lines 17 extending in the second direction perpendicular to the first direction.

For example, the modified layer forming step mentioned above is performed under the following processing conditions.

Light source: LD pumped Q-switched Nd:YVO4 pulsed laser

Figure 8A:
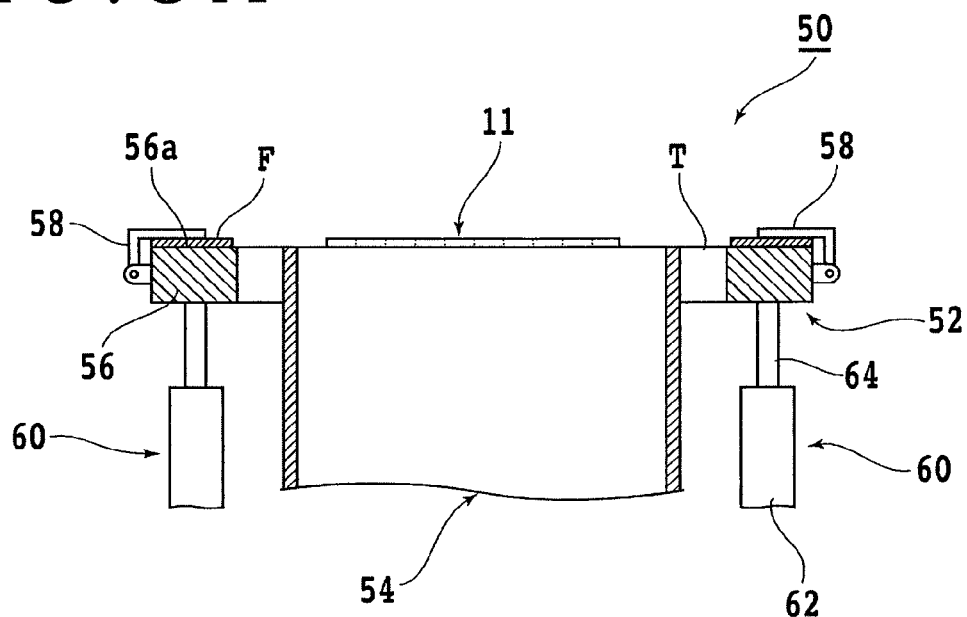
FIGS. 8A and 8B are partially sectional side views showing a dividing step.
Figure 8B:
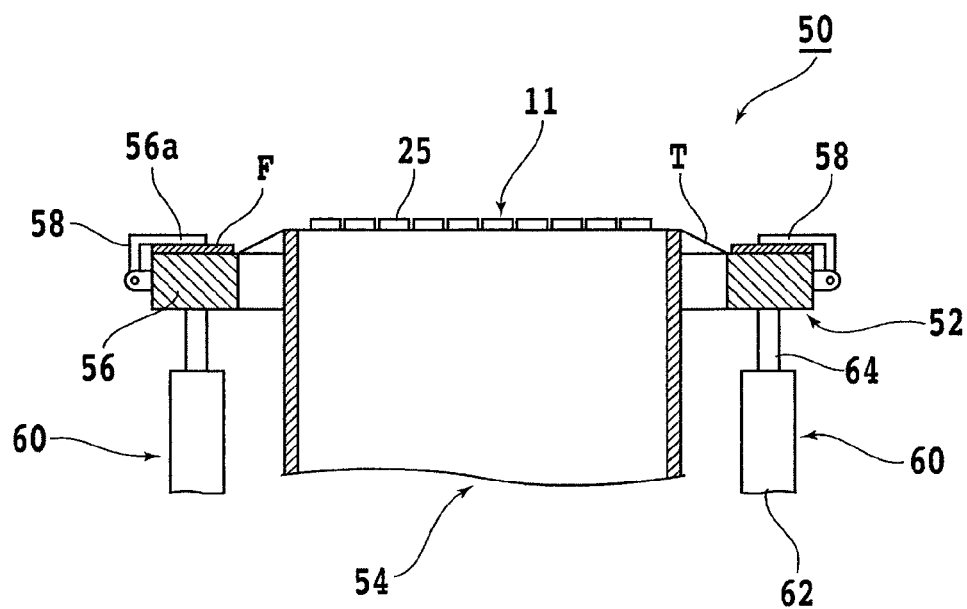

Wavelength: 1064 nm
Repetition frequency: 100 kHz
Pulse power: 10 µJ
Focused spot diameter: 1 µm
Work feed speed: 100 mm/s After performing the modified layer forming step mentioned above, a dividing step is performed as shown in FIGS. 8A and 8B in such a manner that the wafer 11 is divided by using a dividing apparatus 50 to manufacture a plurality of MEMS device chips. Referring to FIG. 8A, the dividing apparatus 50 includes a frame holding unit 52 for holding the annular frame F and an expanding drum 54 for expanding the expansible tape T attached to the annular frame F held by the frame holding unit 52.

The frame holding unit 52 is composed of an annular frame holding member 56 and a plurality of clamps 58 as fixing means provided on the outer circumference of the frame holding member 56. The upper surface of the frame holding member 56 functions as a mounting surface 56a for mounting the annular frame F thereon. The dividing apparatus 50 further includes driving means 60 composed of a plurality of air cylinders 62 for vertically moving the frame holding member 52 between a reference position where the mounting surface 56a is substantially equal in height to the upper end of the expanding drum 54 as shown in FIG. 8A and an expansion position where the mounting surface 56a is lower in height than the upper end of the expanding drum 54 by a predetermined amount as shown in FIG. 8B. Each air cylinder 62 is provided with a piston rod 64 connected to the lower surface of the frame holding member 56.

In performing the dividing step, the annular frame F supporting the wafer 11 through the expansible tape T is mounted on the mounting surface 56a of the frame holding member 56 and fixed to the frame holding member 56 by the clamps 58 as shown in FIG. 8A. At this time, the frame holding member 56 is set at the reference position where the height of the mounting surface 56a is substantially the same as that of the upper end of the expanding drum 54. Thereafter, the air cylinders 62 are operated to lower the frame holding member 56 to the expansion position shown in FIG. 8B. Accordingly, the annular frame F fixed to the mounting surface 56a of the frame holding member 56 is also lowered, so that the expansible tape T supported to the annular frame F comes into abutment against the upper end of the expanding drum 54 and is expanded mainly in its radial direction as shown in FIG. 8B (external force applying step).

Figure 9:
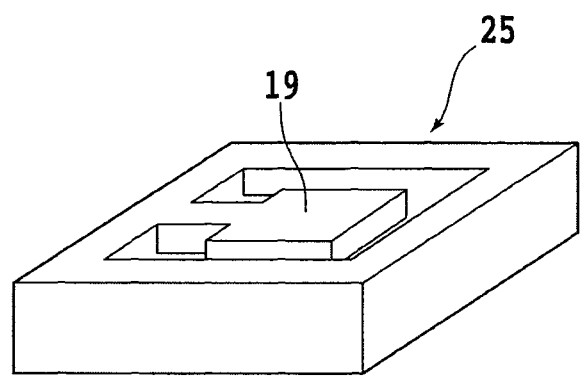
FIG. 9 is a perspective view of a MEMS device chip manufactured by the manufacturing method of the present invention.

As a result, a tensile force acts on the wafer 11 attached to the expansible tape T in the radial direction of the wafer 11. Accordingly, when the tensile force acts on the wafer 11 in its radial direction, the wafer 11 is divided along the modified layers 23 as the break start points to obtain individual MEMS device chips 25 because each modified layer 23 formed inside the wafer 11 is reduced in strength. FIG. 9 is a perspective view of each MEMS device chip 25.

In the modification where the front side 11a of the wafer 11 is attached to a foamed release tape, the wafer 11 is divided into the individual MEMS device chips 25 by performing ablation using a laser beam or by performing blade dicing in a dicing apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A MEMS device chip manufacturing method comprising:
 a grinding step of grinding a device forming area of a wafer to thereby form a recess and an annular reinforcing portion surrounding said recess;
 a MEMS device forming step of performing a processing step including one or more of a photolithography process or an etching process to said wafer after performing said grinding step to thereby form a plurality of MEMS devices partitioned by a plurality of crossing division lines in said device forming area; and
 a dividing step of dividing said wafer along said division lines after performing said MEMS device forming step to thereby manufacture a plurality of MEMS device chips.

2. The MEMS device chip manufacturing method according to claim 1, wherein said dividing step comprises:
 a modified layer forming step of applying a laser beam having a transmission wavelength to said wafer along each division line so as to focus said laser beam inside said wafer, thereby forming a modified layer inside said wafer along each division line; and
 an external force applying step of applying an external force to said wafer after performing said modified layer forming step to thereby divide said wafer into said individual MEMS device chips along each division line where said modified layer is formed as a break start point.

\* \* \* \* \*